United States Patent
Apalkov et al.

(10) Patent No.: US 9,825,220 B2
(45) Date of Patent: Nov. 21, 2017

(54) B2-MTJ DESIGN WITH TEXTURE BLOCKING DECOUPLING LAYER FOR SUB-25 NM STT-MRAM

(71) Applicant: Samsung Electronics Co., Ltd., Suwon-si, Gyeonggi-do (KR)

(72) Inventors: Dmytro Apalkov, San Jose, CA (US); Xueti Tang, Fremont, CA (US); Dustin Erickson, Morgan Hill, CA (US); Vladimir Nikitin, Campbell, CA (US); Roman Chepulskyy, Milpitas, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/080,576

(22) Filed: Mar. 24, 2016

(65) Prior Publication Data
US 2017/0141156 A1    May 18, 2017

Related U.S. Application Data

(60) Provisional application No. 62/256,109, filed on Nov. 16, 2015.

(51) Int. Cl.
| | | |
|---|---|---|
| *H01L 29/82* | (2006.01) | |
| *H01L 43/12* | (2006.01) | |
| *H01L 43/08* | (2006.01) | |
| *G11C 11/16* | (2006.01) | |

(52) U.S. Cl.
CPC .......... *H01L 43/12* (2013.01); *G11C 11/161* (2013.01); *H01L 43/08* (2013.01)

(58) Field of Classification Search
CPC ......... H01L 43/02; H01L 43/10; H01L 43/12; H01L 29/82
See application file for complete search history.

(56) References Cited

U.S. PATENT DOCUMENTS

| | | |
|---|---|---|
| 8,836,000 B1 | 9/2014 | Lin |
| 2015/0008550 A1 | 1/2015 | Min et al. |
| 2015/0129997 A1 | 5/2015 | Tang et al. |
| 2016/0190434 A1* | 6/2016 | Hu ........................ G11C 11/161 257/421 |

* cited by examiner

*Primary Examiner* — Mohsen Ahmadi
*Assistant Examiner* — Scott Stowe
(74) *Attorney, Agent, or Firm* — Renaissance IP Law Group LLP

(57) ABSTRACT

A magnetic tunnel junction device and a method to make the device are disclosed. The magnetic tunnel junction device comprises a first reference magnetic material layer, a tunnel barrier material layer, a free magnetic material layer between the first reference magnetic material layer and the tunnel barrier material layer, and a second reference magnetic material layer disposed on an opposite side of the tunnel barrier material layer from the free magnetic material layer, in which the second reference magnetic material layer is anti-magnetically exchanged coupled with the first reference magnetic material layer. A shift field $H_{shift}$ experienced by the free magnetic material layer is substantially canceled by the anti-magnetic exchange coupling between the first reference magnetic material layer and the second reference magnetic material layer.

18 Claims, 7 Drawing Sheets

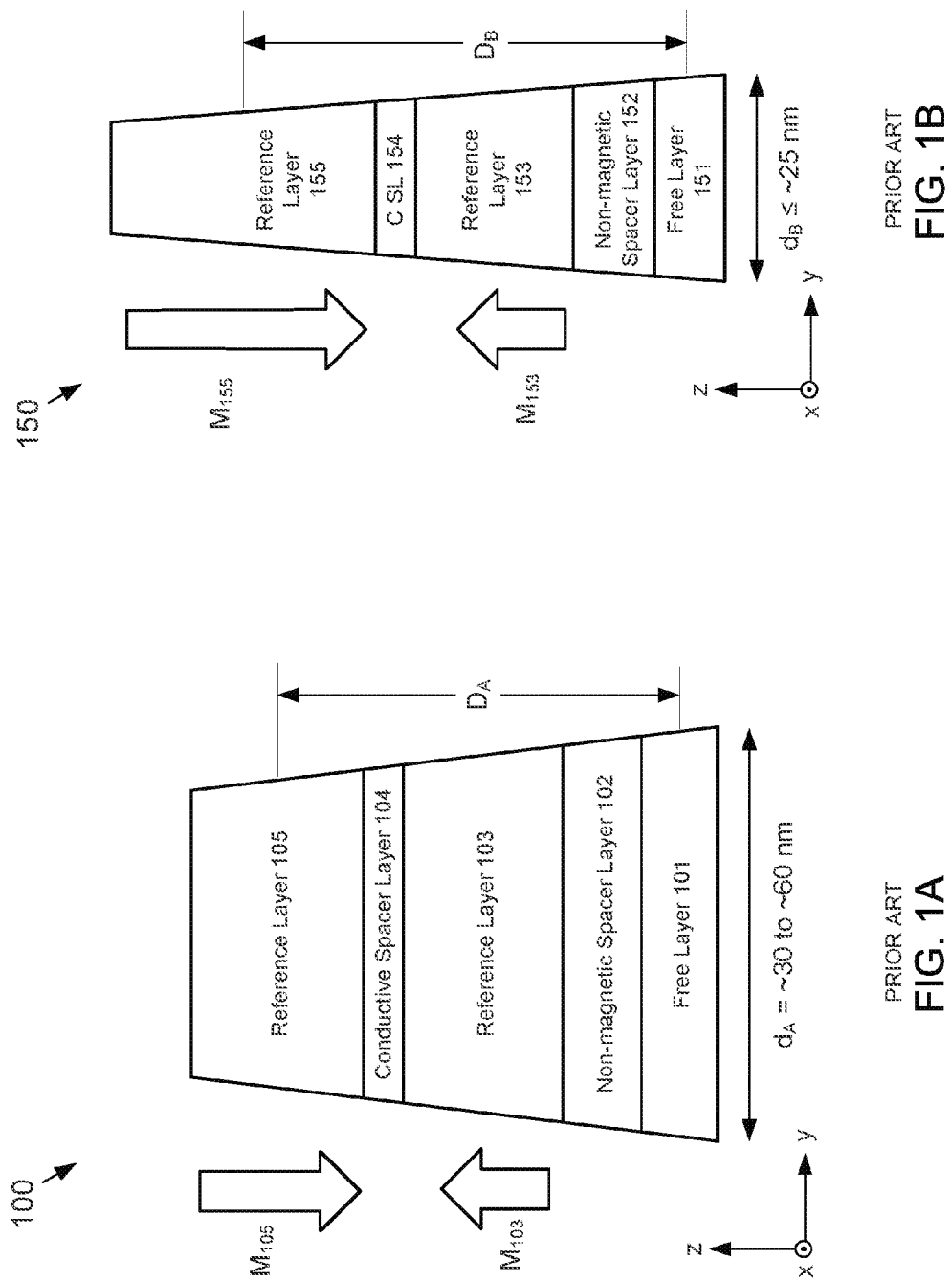
PRIOR ART
FIG. 1B
PRIOR ART
FIG. 1A

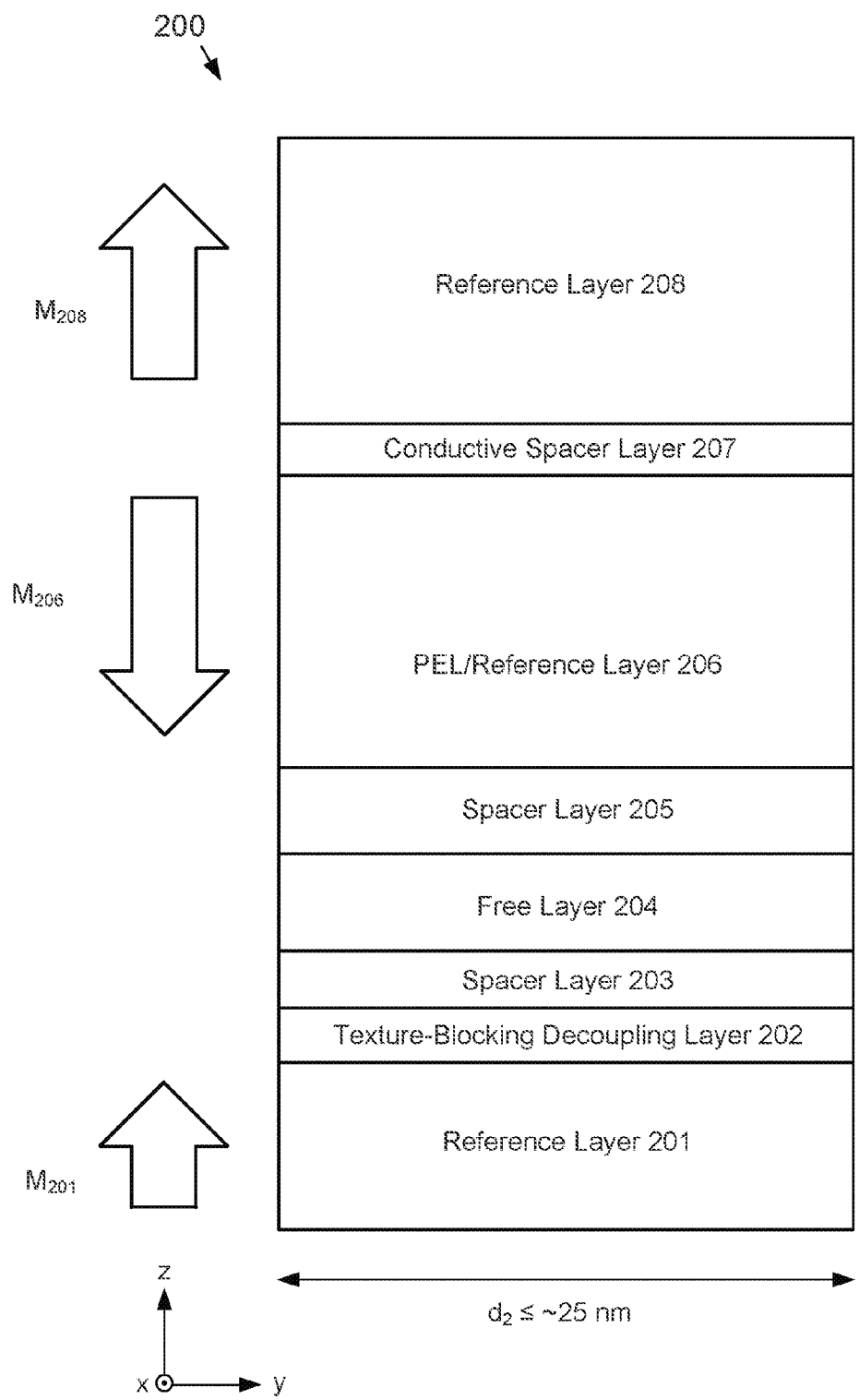
FIG. 2

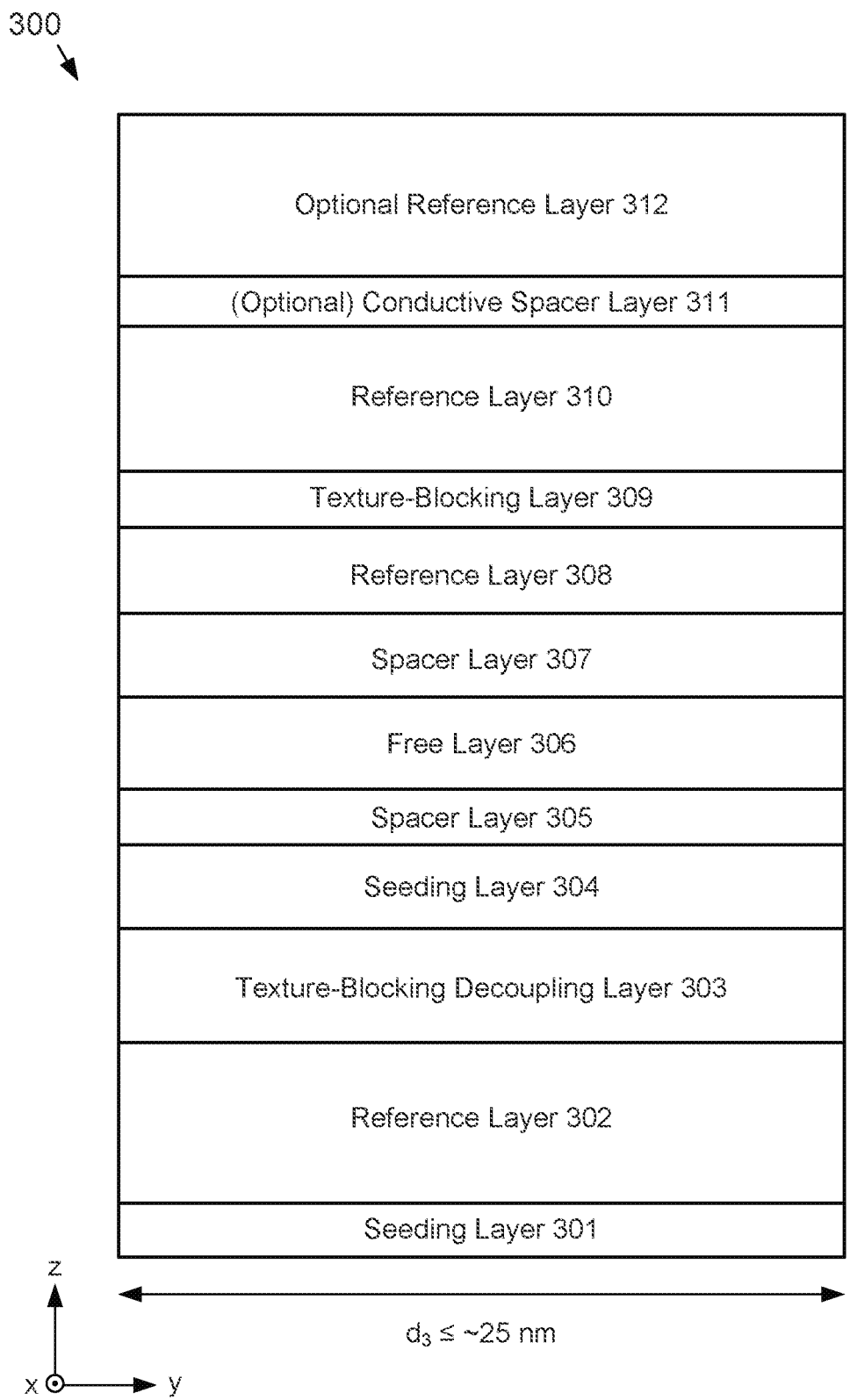
FIG. 3

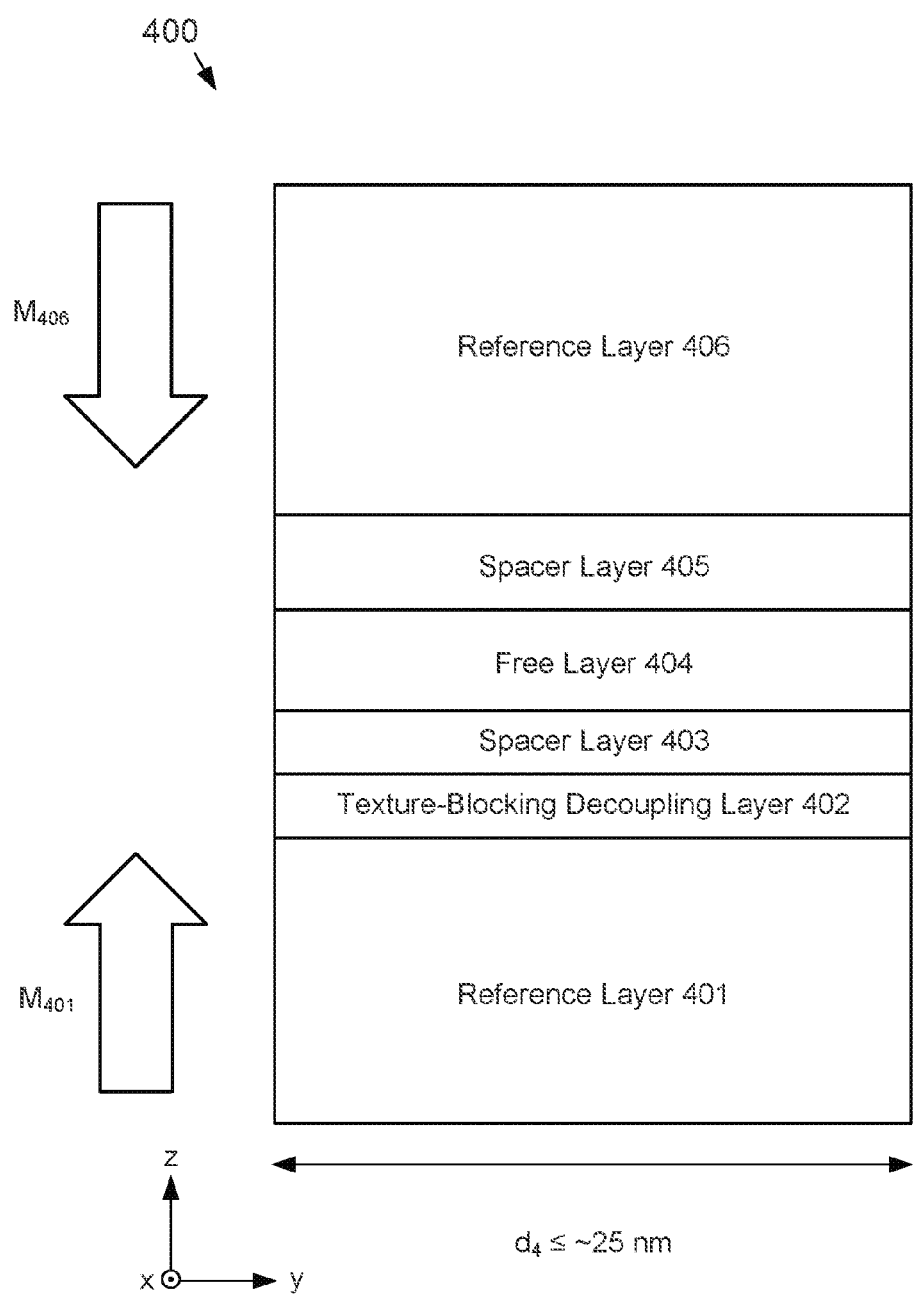
FIG. 4

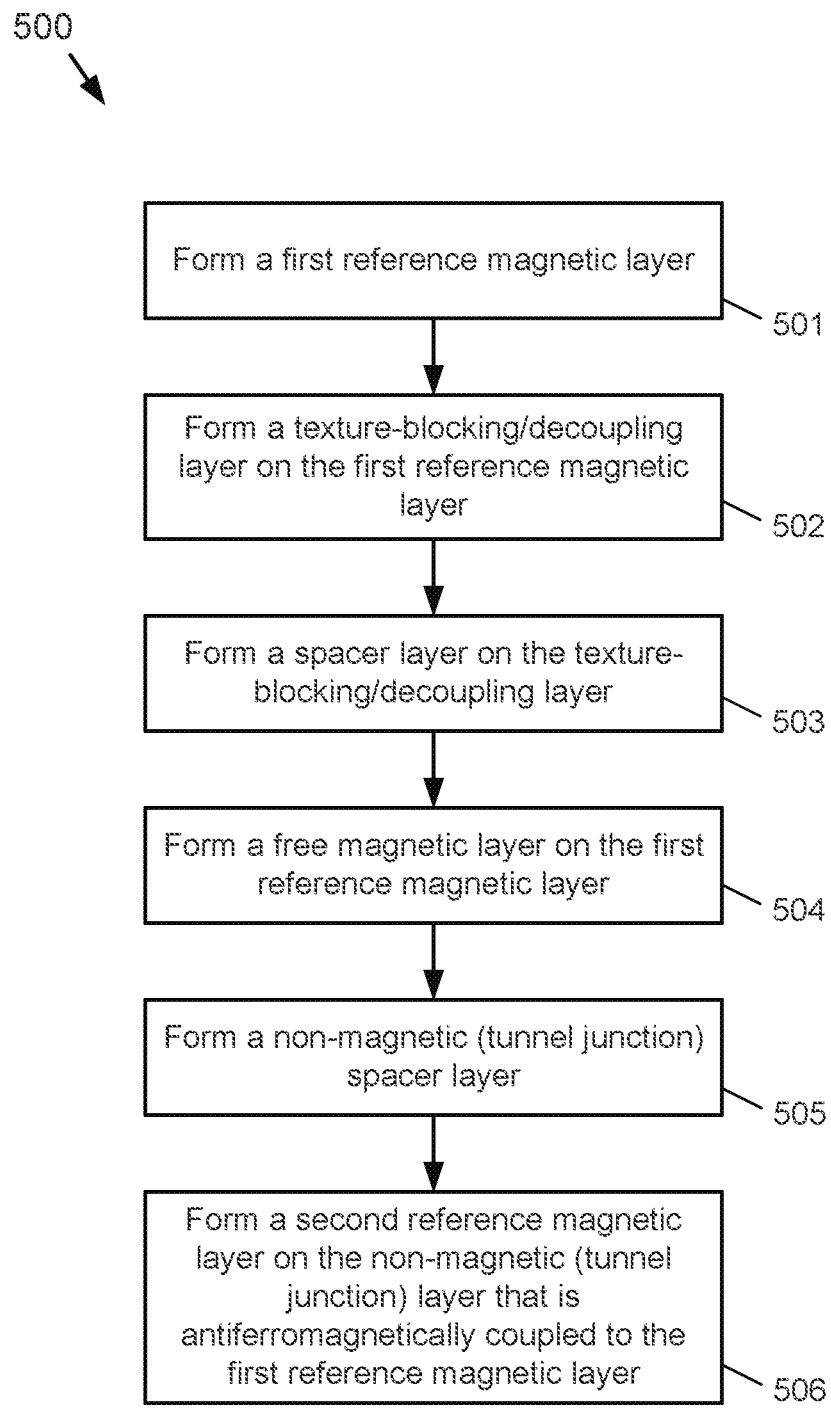
FIG. 5

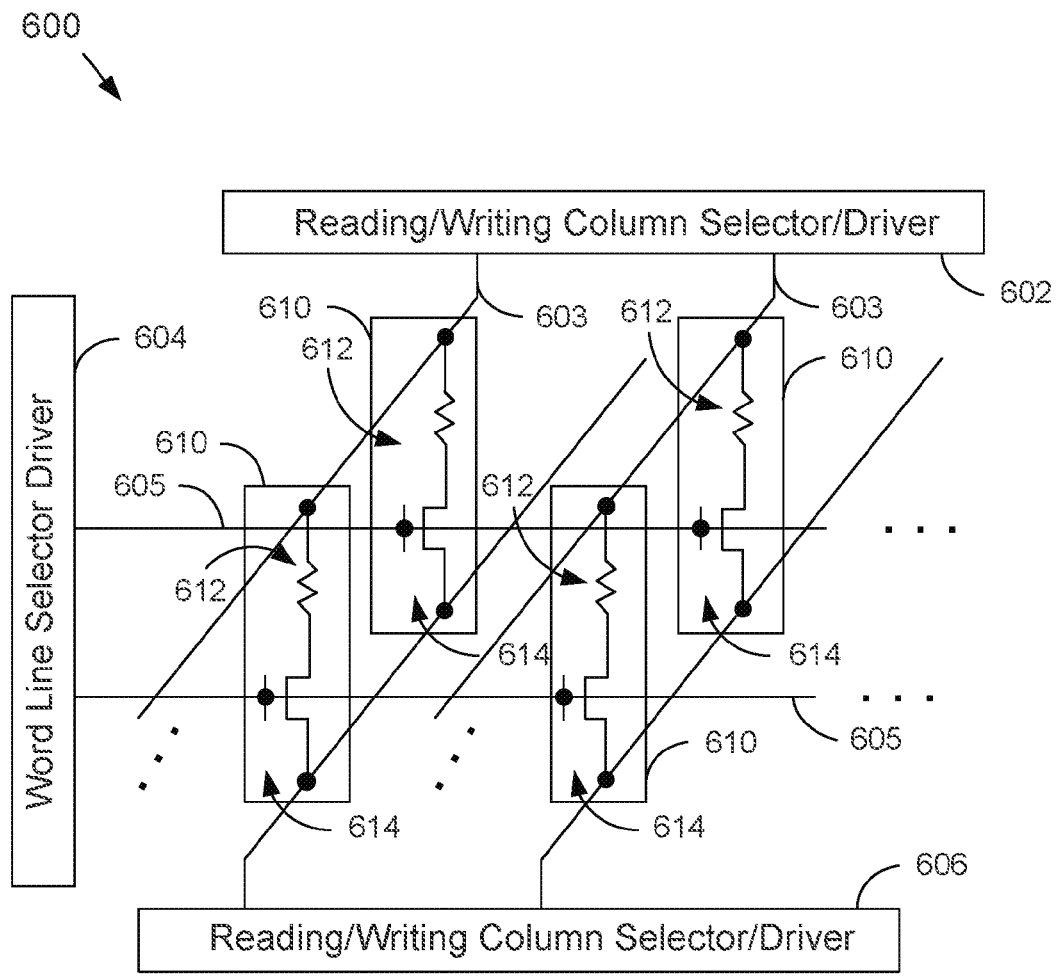
FIG. 6

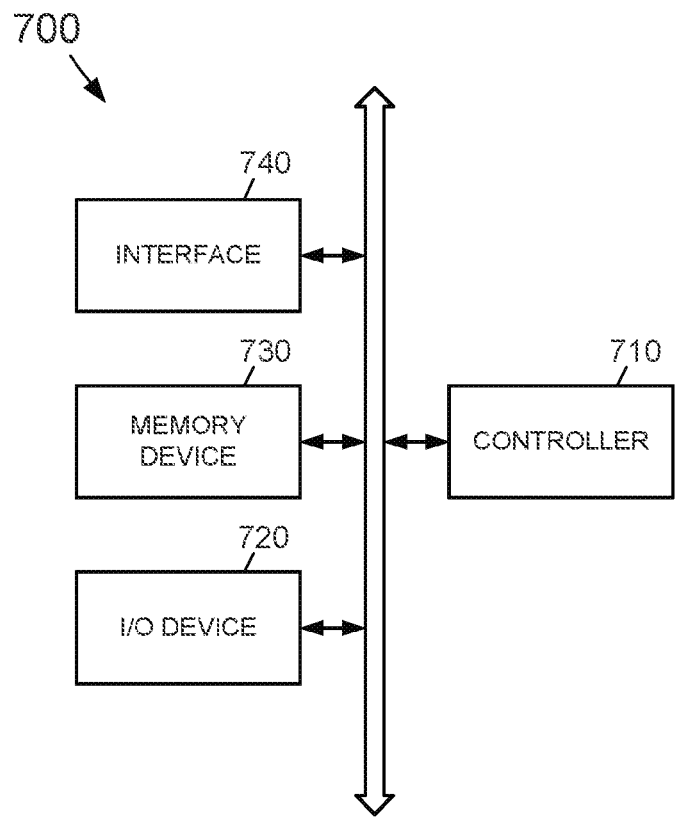
FIG. 7
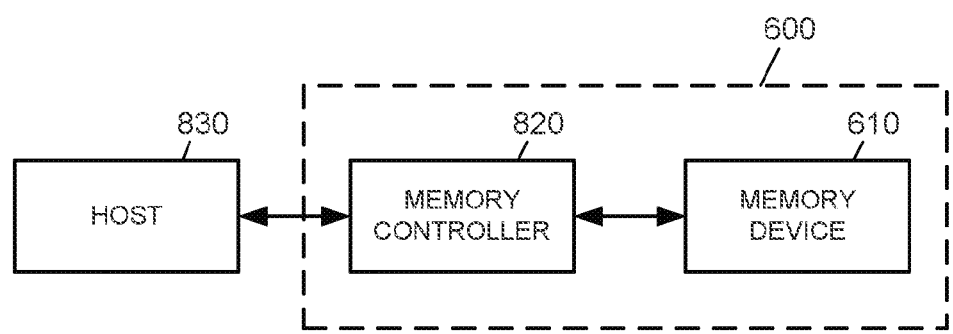
FIG. 8

B2-MTJ DESIGN WITH TEXTURE BLOCKING DECOUPLING LAYER FOR SUB-25 NM STT-MRAM

CROSS-REFERENCE TO RELATED APPLICATION

This patent application claims the priority benefit under 35 U.S.C. §119(e) of U.S. Provisional Patent Application No. 62/256,109 filed on Nov. 16, 2015, the disclosure of which is incorporated herein by reference in its entirety.

TECHNICAL FIELD

The subject matter disclosed herein generally relates to memory devices, and more particularly, to a magnetic memory devices.

BACKGROUND

Commonly known magnetic memory devices may include a magnetic tunnel junction pattern (MTJ) that is formed by two magnetic substances and an insulation layer interposed therebetween. The resistance value of the MTJ pattern may be varied according to the magnetization directions of the two magnetic substances with respect to each other. In some embodiments, a switching current $J_{c0}$ is passed through the MTJ pattern to vary the magnetization direction of one of the magnetic substances with respect to the other magnetic substance. If the magnetization directions of the two magnetic substances are anti-parallel to each other, the magnetic tunnel junction pattern may have a high resistance value. If the magnetization directions of the two magnetic substances are parallel to each other, the magnetic tunnel junction pattern may have a low resistance value. The difference between the resistance values of the two magnetization states may be used to write/read data.

SUMMARY

An exemplary embodiment provides a magnetic tunnel junction device, comprising a first reference magnetic material layer, a free magnetic material, a tunnel barrier material layer between the first reference magnetic material layer and the free layer, and a second reference magnetic material layer disposed on an opposite side of the tunnel barrier material layer from the free magnetic material layer, in which the second reference magnetic material layer has a magnetization substantially antiparallel to the magnetization of the first reference magnetic material layer. A non-magnetic spacer layer and a texture-blocking layer are between the second reference layer and the free layer. A shift field $H_{shift}$ experienced by the free magnetic material layer is substantially canceled by two antiparallel magnetostatic fields acting on the free layer from the first reference magnetic material layer and the second reference magnetic material layer.

An exemplary embodiment provides a magnetic memory device, comprising a first reference ferromagnetic material layer comprising a first surface and a magnetic field direction that includes a component that is substantially perpendicular to the first surface; a free ferromagnetic material layer, a tunnel barrier layer between the first reference ferromagnetic material layer and the free layer in which the free ferromagnetic material layer has a magnetization direction that includes a component that is substantially perpendicular to the first surface; and a second reference ferromagnetic material layer disposed on an opposite side of the tunnel barrier material layer from the free ferromagnetic material layer in which the second reference ferromagnetic material layer comprises a magnetization direction that includes a component that is substantially perpendicular to the first surface, and in which the second reference ferromagnetic material layer has magnetization substantially antiparallel to the magnetization of the first ferromagnetic reference layer. A shift field $H_{shift}$, which is the total magnetostatic field experienced by the free ferromagnetic material layer is substantially canceled by the two antiparallel magnetostatic fields of substantially equal magnitude from the first reference ferromagnetic material layer and the second reference ferromagnetic material layer. The magnetic memory device comprises a diameter that is less than about 25 nm.

An exemplary embodiment provides a method to form a magnetic tunnel junction device in which the method comprises forming a first reference ferromagnetic material layer comprising a first surface and a magnetic field direction that includes a component that is substantially perpendicular to the first surface; forming a first tunnel barrier material layer on the first reference ferromagnetic material layer, forming a free ferromagnetic material layer on the first tunnel barrier material layer in which the free ferromagnetic material layer comprises a magnetization direction that includes a component that is substantially perpendicular to the first surface; forming a second tunnel barrier material layer on the free ferromagnetic material layer; and forming a second reference ferromagnetic material layer on the second tunnel barrier material layer in which the second reference ferromagnetic material layer comprises a magnetic field direction that includes a component that is substantially perpendicular to the first surface, and in which the magnetization of the second reference ferromagnetic material layer is antiparallel to the magnetization of the first reference ferromagnetic material layer. A shift field $H_{shift}$ experienced by the free ferromagnetic material layer is substantially canceled by the two magnetostatic fields from the first reference ferromagnetic material layer and the second reference ferromagnetic material layer, and a diameter the magnetic tunnel junction is less than about 25 nm. In some embodiments, one or both of the tunnel barriers may be a conducting non-magnetic spacer layer.

BRIEF DESCRIPTION OF THE DRAWINGS

In the following section, the aspects of the subject matter disclosed herein will be described with reference to exemplary embodiments illustrated in the figures, in which:

FIG. 1A depicts a cross-sectional view of an illustrative conventional topology of a pillar-shaped magnetic tunnel junction (MTJ) device having a device diameter $d_A$ of between about 30 nm to about 60 nm;

FIG. 1B depicts a cross-sectional view of a comparative illustrative conventional topology of a pillar-shaped BMTJ device having a device diameter $d_B$ that is less than about 25 nm;

FIG. 2 depicts a cross-sectional view of a first exemplary embodiment of a pillar-shaped BMTJ-type device according to the subject matter disclosed herein;

FIG. 3 depicts a cross-sectional view of a second exemplary embodiment of a pillar-shaped B2-MTJ device according to the subject matter disclosed herein;

FIG. 4 depicts a cross-sectional view of a third exemplary embodiment of a pillar-shaped B2-MTJ device according to the subject matter disclosed herein;

FIG. 5 is an exemplary embodiment of a method to form a B2-MTJ device according to the subject matter disclosed herein;

FIG. 6 depicts an exemplary embodiment of a magnetic memory that includes a magnetic tunnel junction (MTJ) device according to the subject matter disclosed herein;

FIG. 7 depicts an electronic device that comprises one or more integrated circuits (chips) comprising a magnetic tunnel junction (MTJ) device according to the subject matter disclosed herein; and FIG. 8 depicts a memory system that may comprise a magnetic tunnel junction (MTJ) device according to the subject matter disclosed herein.

DETAILED DESCRIPTION

The subject matter disclosed herein relates to an arrangement of a magnetic tunnel junction (MTJ) device and a method to make the MTJ device in which a first magnetic reference layer is disposed on one side of a tunnel junction barrier from the free layer and a second magnetic reference layer that has a magnetization antiparallel to the magnetization of the first reference magnetic layer is disposed on the other side of the free layer, separated by the second tunnel junction barrier.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment is included in at least one embodiment disclosed herein. Thus, the appearances of the phrases "in one embodiment" or "in an embodiment" or "according to one embodiment" (or other phrases having similar import) in various places throughout this specification are not necessarily all referring to the same embodiment. As used herein, the word "exemplary" means "serving as an example, instance, or illustration." Any embodiment described herein as "exemplary" is not to be construed as necessarily preferred or advantageous over other embodiments. Furthermore, the particular features, structures, or characteristics may be combined in any suitable manner in one or more embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

The exemplary embodiments described herein are described in the context of particular magnetic junctions and magnetic memories having certain components, arrangements and/or configurations. It should be understood that the subject matter disclosed herein is consistent with the use of magnetic junctions and magnetic memories having other and/or additional components and/or other features that are not inconsistent with the subject matter disclosed herein. A method and system are also disclosed in the context of current understanding of the spin-transfer phenomenon, of magnetic anisotropy, and/or of other physical phenomenon. Consequently, it should be understood that any theoretical explanations of behavior of the disclosed method and system are made based upon this current understanding of spin transfer, magnetic anisotropy and/or other physical phenomenon. The disclosed method and system described herein, however, are not dependent upon a particular physical explanation. It should also be understood that the disclosed method and system are described in the context of a structure having a particular arrangement and/or configuration. It should be understood that the method and system may be consistent with other structures. Additionally, the disclosed method and system are described in the context of certain layers being simple, multilayer and/or synthetic. It should be understood, however, that the layers may have another structure. Furthermore, the method and system are described in the context of magnetic junctions and/or substructures having particular layers. It should be understood that magnetic junctions and/or substructures having additional and/or different layers that are not inconsistent with the disclosed method and system could also be used. Moreover, certain components may be described as being magnetic, ferromagnetic, and ferrimagnetic. As used herein the term "magnetic" or "ferromagnetic" includes, but is not limited to ferromagnets and ferrimagnets. The method and system are also disclosed in the context of single magnetic junctions and substructures. It should be understood that the disclosed method and system are consistent with the use of magnetic memories having multiple magnetic junctions and using multiple substructures. Further, as used herein, the term "in-plane" is substantially within or substantially parallel to the plane of one or more of the layers of a magnetic junction. Conversely, the term "perpendicular" corresponds to to direction that is substantially perpendicular to one or more of the layers of the magnetic junction.

As dimensions of MTJ devices shrink to have device diameters of less than about 25 nm, the total magnetic field $H_{shift}$ that is experienced by the free layer that is located on the other side of a tunnel barrier layer from the reference layer becomes difficult to reduce to be zero or substantially zero. The subject matter disclosed herein relates to an arrangement of a magnetic tunnel junction (MTJ) device and a method to make the MTJ device in which a first magnetic reference layer and a free magnetic layer are disposed on one side of a tunnel junction barrier and a second magnetic reference layer that has a magnetization antiparallel to the first reference magnetic layer is disposed on the other side of the tunnel junction barrier. By locating the second reference layer on the other side of the free layer from the tunnel barrier layer, it is possible to substantially cancel the total magnetic coupling from the reference layers to the free layer. Additionally, embodiments of the subject matter disclosed herein provide a more controllable magnetic coupling $H_{shift}$ having less variation as cell-to-cell size varies, and a efficient shift field $H_{shift}$ cancellation that results in a smaller overall device thickness.

Further, the subject matter disclosed herein provides a thinner MTJ device stack and provides better stability of the PEL/PL1 because a smaller stray field is generated in comparison to a configuration in which the second reference layer above the first reference layer and distal to the free layer. Further still, the configuration provides no substantial reduction in TMR as compared to a conventional MTJ device in which a free layer is disposed on the other side of a tunnel barrier layer from a first and second reference layer.

FIG. 1A depicts a cross-sectional view of an illustrative conventional topology of a pillar-shaped magnetic tunnel junction (MTJ) device 100 having a device diameter $d_A$ of between about 30 nm to about 60 nm. The illustrative MTJ device 100 may comprise a stack of a free layer 101, a first non-magnetic spacer layer 102, a first reference (or pinned) layer 103, a conductive spacer layer 104 and a second reference (or pinned) layer 105. For this illustrative topology, the first non-magnetic spacer layer 102 may comprise a tunnel junction layer. It should be understood that illustrative MTJ device 100 may comprise other layers that are not shown, such as, but not limited to, a substrate, a bottom contact, one or more seed layers, one or more antiferromagnetic (AFM) layers, one or more additional reference layers, one or more polarization enhancement layers (PELs), one or more texture blocking layers, one or more tunneling barrier layers, one or more additional free layers, a capping layer, and a top contact. Additionally, it should be understood that for the illustrative topology of MTJ device 100, the free layer 101 is disposed between a bottom contact and substrate (both not shown) on one side of free layer 101, and the non-magnetic spacer (tunnel junction) layer 102 on the other side. Consequently, the topology of MTJ 100 is referred to herein as a Bottom MTJ (BMTJ) because the location of the free layer 101 is proximate to the substrate (and below the first non-magnetic spacer layer 102) and the two reference layers 103 and 105 being distal to the substrate (and above the first non-magnetic spacer layer).

The free layer 101 may comprise ferromagnetic material, such as CoFeB, that is about 1-2 nm thick. The first non-magnetic spacer layer 102 may comprise a layer of MgO that is about 1 nm thick. The first reference layer 103 may comprise a layer of ferromagnetic materials, such as CoFeB, [Co/Pt]n, [Co/Pd]n, [Co/Ni]n, [Co/Ir]n, [Co/Ru]n, with a potentially thin non-magnetic layer, such as Ta, W, Ru, Ti, Mg, V or Cr inserted one or more types between the materials of different crystal symmetries. Total thickness of reference layer 103 is between about 1 and about 6 nm thick. The second non-magnetic spacer layer may comprise a layer of Ru, Jr, Rh or multilayer or alloy of these materials and the total thickness of the conductive spacer layer 104 is between about 3 Å and about 2 nm. The second reference layer 105 may comprise a layer of a ferromagnetic material that is between about 1 and about 15 nm thick and that is in antiferromagnetic exchange coupling with the first reference layer 103. The second reference layer 105 may alternatively comprise a multilayer structure that is between about 1 and about 15 nm thick and may be a multilayer stack formed from [Co/Pt]m, [Co/Pd]m, [Co/Ni]m, [Co/Ir], [Co/Ru]m in which m is a stacking number of each layer and is an integer greater than or equal to 2.

For the illustrative topology of BMTJ device 100 depicted in FIG. 1A, the various layers are generally arranged as planar layers that are oriented substantially parallel to the x-y plane in which the x-axis is indicated as extending outwardly from (and inwardly to) the plane of the figure, and the y-axis is indicated as extending horizontally in the figure and perpendicular to the x-axis. That is, the various layers comprising BMTJ device 100 respectively extend in a planar direction that is substantially parallel to the x-y plane. The various layers of the BMTJ device 100 are arranged, or stacked, with respect to each other in a direction that is substantially parallel to the z-axis in which the z-axis is oriented upwardly in the figure and perpendicular to both the x- and y-axes. The same Cartesian axis system is used in the various figures herein. The particular Cartesian axis system used herein has been selected for convenience and it should be understood that an alternative Cartesian axis system could be used.

For BMTJ 100, the anisotropy of the free layer 101, the first reference layer 103 and the second reference layer 105 favors a vertical, or perpendicular, magnetization, i.e., in the direction of the z-axis in FIG. 1A. Additionally, the first reference layer 103 and the second reference layer 105 are in antiferromagnetic magnetic exchange coupling with each other via the conductive spacer 104, and the direction of magnetization $M_{103}$ in the ferromagnetic layer 103 is opposite to (antiparallel to) the magnetization $M_{105}$ of the ferromagnetic layer 105. Therefore, if the direction of magnetization in the ferromagnetic layer 103 is upward, as depicted by the upward arrow in FIG. 1A, the direction of magnetization in the ferromagnetic layer 105 is downward, as depicted by the downward arrow.

FIG. 1B depicts a cross-sectional view of a comparative illustrative conventional topology of a pillar-shaped BMTJ device 150 having a device diameter $d_B$ that is less than about 25 nm. Similar to the illustrative configuration of MTJ 100, the illustrative MTJ device 150 may comprise a stack of a free layer 151, a first non-magnetic spacer layer 152, a first reference layer 153, a conductive spacer layer (C SL) 154 and a second reference layer 155. The various layers of illustrative MTJ device 150 may comprise substantially the same physical arrangement, materials, thicknesses and anisotropy as that of the corresponding layers of illustrative MTJ device 100, except that the thickness of second reference layer 155 may be substantially greater than the second reference layer 105, as will be described below. It should be understood that for the topology of MTJ device 150, the free layer 151 is disposed between a bottom contact and substrate (both not shown) on one side of free layer 151, and the non-magnetic spacer (tunnel junction) layer 152 on the other side. Thus, the topology of MTJ 150 is also referred to herein as a Bottom MTJ (BMTJ) because the location of the free layer 151 is proximate to the substrate and the two reference layers 153 and 155 are distal to the substrate. Further, it should be understood that BMTJ device 150 may comprise other layers that are not shown, such as, but not limited to, a substrate, a bottom contact, one or more seed layers, an antiferromagnetic (AFM) layer, one or more additional reference layers, one or more polarization enhancement layers (PELs), one or more texture blocking layers, one or more tunneling barrier layer, one or more additional free layers, a capping layer, and a top contact.

Referring to BMTJ device 100, the magnetic shift field $H_{shift}$ that is experienced by magnetization of the free layer 101 should ideally be canceled or substantially canceled so that the thermal stability of the free layer is symmetrical in two states with free layer magnetization pointing up or down. The shift field $H_{shift}$ is the total magnetostatic field from the reference layers 155 and 153 experienced by the free layer magnetization. For BMTJ device 150, the shift field $H_{shift}$ is the residual magnetic field resulting from the difference between magnetostatic field from magnetization $M_{153}$ and the magnetostatic field from the magnetization $M_{155}$ that is experienced by the free layer 151.

For BMTJ devices having device diameters d that are between about 30 nm and about 60 nm (FIG. 1A), this is relatively easily accomplished by adding additional magnetic material to the thickness of the second reference layer. For BMTJ devices having device diameters d that are less than about 25 nm (FIG. 1B), adding additional magnetic material to the second reference layer does not effectively cancel the shift field $H_{shift}$ because the efficiency of the additional magnetic material to cancel the shift field $H_{shift}$ is significantly reduced as the material is located further and further from the free layer. For example, the relatively larger size of the BMTJ device 100 (i.e., the larger device diameter $d_A$) in comparison to the size of the BMTJ 150 (i.e., device diameter $d_B$) allows the shift field $H_{shift}$ to be more efficiently canceled or substantially canceled because the average distance $D_A$ between the total volume of the magnetic material in reference layer 105 and free layer 101 is less than the average distance $D_B$ between the total volume of the magnetic material in reference layer 155 and free layer 151. Thus, adding additional magnetic material to the top of second reference layer of a BMTJ device 150 ends up making the overall stack taller without substantially contributing to the cancellation of the shift field $H_{shift}$.

FIG. 2 depicts a cross-sectional view of a first exemplary embodiment of a pillar-shaped BMTJ-type device 200 according to the subject matter disclosed herein. The BMTJ-type device 200 comprises a device diameter $d_2$ that is less than about 25 nm. The BMTJ-type device 200 may comprise a stack of a first reference (or pinned) layer 201, texture-blocking decoupling layer 202, a non-magnetic spacer layer 203, a free layer 204, a non-magnetic spacer layer 205, a polarization enhancement layer (PEL)/second reference layer 206, a conductive spacer layer 207 and a third reference layer 208. The various layers of the BMTJ-type device 200 are generally arranged in planar layers that are oriented substantially parallel to the x-y plane in which the x-axis is indicated as extending outwardly from (and inwardly to) the plane of the figure, and the y-axis is indicated as extending horizontally in the figure and perpendicular to the x-axis. That is, the various layers comprising the BMTJ-type device 200 extend in a planar direction that is substantially parallel to the x-y plane. The various layers of the BMTJ-type device 200 are arranged, or stacked, with respect to each other in a direction that is substantially parallel to the z-axis in which the z-axis is oriented upwardly in the figure and perpendicular to both the x- and y-axes.

The topology of the BMTJ-type device 200 is similar to the topology of the BMTJ devices 100 and 150 in that the free layer 204 is below the spin-torque active reference layer 206. The BMTJ-type device 100, however, is referred to herein as a B2-MTJ device because in addition to the free layer 204 being disposed proximate to the bottom contact and substrate with respect to the non-magnetic spacer (tunnel junction) layer 205, a second reference layer 201 is disposed on the same side of the non-magnetic spacer (tunnel junction) layer 205.

The first reference layer 201 of B2-MTJ device 200 may comprise a ferromagnetic material layer. The texture-blocking decoupling layer 202 is formed on the first reference layer 201 and may comprise an amorphous magnetic or an amorphous non-magnetic material. The spacer layer 203 is formed on the texture-blocking decoupling layer 202 and may comprise a magnetic or a non-magnetic material having a body-centered-cubic (BCC) crystalline structure. In this embodiment, it is desired to have no spin torque or tunneling magnetoresistance effect coming from spacer layer 203. This is achieved by the combination of a spacer layer and a texture blocking decoupling layer. If texture-blocking decoupling layer is nonmagnetic or weakly magnetic but thin, the polarization should be substantially zero, thus greatly reducing spin torque and magnetoresistance coming from the spacer layer 203. The free layer 204 is formed on the spacer layer 203, and may comprise a ferromagnetic material. The spacer (tunnel junction) layer 205 is formed on the free layer 204, and may comprise a non-magnetic material. The PEL/reference layer 206 is formed on the spacer layer 205, and may comprise ferromagnetic material. The conductive spacer layer 207 is formed on the PEL/reference layer 206, and may comprise a conductive material. The second reference layer 208 is formed on the conductive spacer layer 207, and may comprise a ferromagnetic material. The various layers of the B2-MTJ device 200 are formed using well-known techniques.

The anisotropy of the first reference layer 201, the free layer 204, the PEL/reference layer 206 and the second reference layer 208 favors a vertical, or perpendicular, magnetization, i.e., in the direction of the z-axis in FIG. 2. The PEL/reference layer 206 and the second reference layer 208 are in antiferromagnetic magnetic exchange coupling with each other via the conductive spacer layer 207, and the direction of magnetization $M_{206}$ in the ferromagnetic layer 206 is opposite to (antiparallel to) the magnetization $M_{208}$ of the second reference layer 208. Additionally, the magnetization $M_{201}$ of the first reference layer 201 is antiparallel to the magnetization $M_{206}$ of the PEL/reference layer 206.

The shift field $H_{shift}$ experienced by the free layer 204 can be canceled or substantially canceled because the magnetic material of the first reference layer 201 is disposed closer to the free layer 205 than if the magnetic material of the first reference layer 201 was formed to be part of the reference layer 208.

FIG. 3 depicts a cross-sectional view of a second exemplary embodiment of a pillar-shaped B2-MTJ device 300 according to the subject matter disclosed herein. The B2-MTJ device 300 comprises a device diameter $d_3$ that is less than about 25 nm. The B2-MTJ device 300 may comprise a stack of a seeding layer 301, a first reference (or pinned) layer 302, texture-blocking decoupling layer 303, a seeding layer 304, a non-magnetic spacer layer 305, a free layer 306, a non-magnetic spacer layer 307, a second reference layer 308, a texture-blocking layer 309, a third reference layer 310, an optional conductive spacer layer 311, and an optional fourth reference layer 312. The various layers of the B2-MTJ device 300 are generally arranged in planar layers that are oriented substantially parallel to the x-y plane in which the x-axis is indicated as extending outwardly from (and inwardly to) the plane of the figure, and the y-axis is indicated as extending horizontally in the figure and perpendicular to the x-axis. That is, the various layers comprising the B2-MTJ device 300 extend in a planar direction that is substantially parallel to the x-y plane. The various layers of the B2-MTJ device 300 are arranged, or stacked, with respect to each other in a direction that is substantially parallel to the z-axis in which the z-axis is oriented upwardly in the figure and perpendicular to both the x- and y-axes. Additionally, the various layers of the B2-MTJ device 300 are formed using well-known techniques.

The topology of the B2-MTJ device 300 is the free layer 306 is disposed between a bottom contact and substrate (both not shown) on one side of the free layer 306, and the non-magnetic spacer (tunnel junction) layer 307 on the other side of the free layer 306. In addition to the free layer 204 being disposed proximate to the bottom contact and substrate with respect to the non-magnetic spacer (tunnel junction) layer 307, the first reference layer 302 is disposed on the same side of the non-magnetic spacer (tunnel junction) layer 307.

The seeding layer 301 of B2-MTJ device 300 may comprise ruthenium (Ru) or Iridium (Jr) and may have a thickness of about 1-20 nm. The first reference layer 302 is formed on the seeding layer 301 and may comprise a multilayer stack formed from [Co/Pt]m in which m is a stacking number of each layer and is an integer greater than or equal to 2. The first reference layer 302 may have a thickness of about 0.5-5 nm. The material used for the first reference layer 302 is selected to be stable at high temperature. The texture-blocking decoupling layer 303 is formed on the first reference layer 302 and may comprise an amorphous magnetic or an amorphous non-magnetic material, such as $[FeTa]_{2-4}$. The texture-blocking decoupling layer 303 may have a thickness of about 0.5-5 nm. The seeding layer 304 is formed on the texture-blocking decoupling layer 303 and may comprise an amorphous non-magnetic material or an amorphous magnetic material, such as CoFeB, and may have a thickness of about 0.3 nm to about 0.9 nm. The seeding layer 304 may comprise a body-centered-cubic (BCC) crystalline lattice structure. Examples of the seeding material include CoFeB, FeB, and Fe of various compositions. Preferably, boron composition is less than 40% in CoFeB, FeB. Co-to-Fe atomic ratio can be varied from 90% of Fe (10% of Co) to 20% of Fe (80% of Co).

The spacer layer 305 is formed on the seeding layer 304 and may comprise MgO having a thickness of about 1 nm. In one embodiment, the material for spacer layer 305 is selected to be MgO to provide perpendicular magnetic anisotropy (PMA) and reduced damping. In an alternative embodiment, spacer layer 305 may comprise a material that provides a high interface PMA (IPMA), such as tungsten (W). The free layer 306 is formed on the spacer layer 305 and may comprise a ferromagnetic material and may have a thickness of about 0.6-2.5 nm. The spacer layer 307 is formed on the free layer 306 and may comprise a non-magnetic material. In one embodiment, the spacer layer 307 comprises MgO having a thickness of about 1-2 nm.

The reference layer 308 is formed on the spacer layer 307 and may comprise ferromagnetic material. The reference layer 308 may have a thickness of about 0.5 nm to about 2 nm. The texture-blocking layer 309 is formed on the reference layer 308 and may comprise Ta, W, FeTa, CoTa, CoFeBTa or similar nonmagnetic or weakly magnetic amorphous materials, and may have a thickness of about 0.4-3 nm. The reference layer 310 is formed on the texture-blocking layer 309 and may comprise a ferromagnetic material. Alternatively, the reference layer 310 may comprise a multilayer structure that is about 1-5 nm thick and may be a multilayer stack formed from [Co/Pt]m in which m is a stacking number of each layer and is an integer greater than or equal to 2.

An optional conductive spacer layer 311 is formed on the reference layer 310. The optional spacer layer 311 may comprise ruthenium (Ru), Ir, Rh or alloy or multilayer of these materials and may have a thickness of about 0.3 nm to about 1.5 nm. An optional reference layer 312 may be formed on the optional spacer layer 311 and may comprise a ferromagnetic material. Alternatively, the optional reference layer 312 may comprise a multilayer structure that is about 1-8 nm thick and may be a multilayer stack formed from [Co/Pt]m in which m is a stacking number of each layer and is an integer greater than or equal to 2.

The shift field $H_{shift}$ experienced by the free layer 306 can be canceled or substantially canceled because the magnetic material of the first reference layer 302 is disposed closer to the free layer 306 than if the magnetic material of the first reference layer 302 was formed to be part of the reference layer 310. This embodiment provides a significantly reduced sensitivity to variations in the shift field $H_{shift}$ as a function of cell-size variations.

FIG. 4 depicts a cross-sectional view of a third exemplary embodiment of a pillar-shaped B2-MTJ device 400 according to the subject matter disclosed herein. The B2-MTJ device 400 comprises a device diameter $d_4$ that is less than about 25 nm. The B2-MTJ device 400 is configured to have an overall thickness that is less than the thickness of the B2-MTJ device 300. For example, the B2-MTJ device 400 has a thickness that is between about 10-50 nm thick, whereas the B2-MTJ device 300 has a thickness that is between about 20-60 nm. The B2-MTJ device 400 may comprise a stack of a first reference layer 401, a texture-blocking decoupling layer 402, a spacer layer 403, a free layer 404, a non-magnetic spacer (tunnel junction) layer 405, and a second reference layer 406. The various layers of the B2-MTJ-type device 400 are generally arranged in planar layers that are oriented substantially parallel to the x-y plane in which the x-axis is indicated as extending outwardly from (and inwardly to) the plane of the figure, and the y-axis is indicated as extending horizontally in the figure and perpendicular to the x-axis. That is, the various layers comprising the B2-MTJ device 400 extend in a planar direction that is substantially parallel to the x-y plane. The various layers of the B2-MTJ device 400 are arranged, or stacked, with respect to each other in a direction that is substantially parallel to the z-axis in which the z-axis is oriented upwardly in the figure and perpendicular to both the x- and y-axes.

The topology of the B2-MTJ device 400 is the free layer 404 is disposed between a bottom contact and substrate (both not shown) on one side of the free layer 404, and the non-magnetic spacer (tunnel junction) layer 405 on the other side of the free layer 404. In addition to the free layer 404 being disposed proximate to the bottom contact and substrate with respect to the non-magnetic spacer (tunnel junction) layer 405, the first reference layer 401 is disposed on the same side of the non-magnetic spacer (tunnel junction) layer 405.

The first reference layer 401 of B2-MTJ device 400 may comprise a ferromagnetic material layer. The first reference layer 401 and may comprise a multilayer stack formed from [Co/Pt]m in which m is a stacking number of each layer and is an integer greater than or equal to 2, and the first reference layer 401 may have a thickness of about 0.5-5 nm. The material used for the first reference layer 401 is selected to be stable at high temperature. The decoupling/texture blocking layer 402 is formed on the first reference layer 401 and may comprise an amorphous magnetic or an amorphous non-magnetic material, such as $[FeTa]_{2-4}$. The texture-blocking decoupling layer 402 may have a thickness of about 0.5-5 nm. The spacer layer 403 is formed on the texture-blocking decoupling layer 402 and may comprise a magnetic or a non-magnetic material having a body-centered-cubic (BCC) crystalline structure. In one embodiment, the spacer layer 403 may comprise MgO having a thickness of about 1 nm. In one embodiment, the material for spacer layer 305 is selected to be MgO to provide perpendicular magnetic anisotropy (PMA) and reduced damping. In an alternative embodiment, spacer layer 305 may comprise a material that provides a high interface PMA (IPMA), such as tungsten (W). The free layer 404 is formed on the spacer layer 403 and may comprise a ferromagnetic material having a thickness of about 0.6-2.5 nm. The spacer layer 405 is formed on the free layer 404 and may comprise a non-magnetic material, such as MgO, having a thickness of about 1-2 nm. The second reference layer 406 is formed on the spacer layer 405 and may comprise ferromagnetic material. The various layers of the B2-MTJ device 400 are formed using well-known techniques.

The anisotropy of the first reference layer 401, the free layer 404, the second reference layer 406 favors a vertical, or perpendicular, magnetization, i.e., in the direction of the z-axis in FIG. 4. The first reference layer 401 and the second reference layer 406 are in antiferromagnetic magnetic exchange coupling with each other, and the direction of magnetization $M_{401}$ in the first reference layer 401 is opposite to (antiparallel to) the magnetization $M_{406}$ of the second reference layer 406.

The shift field $H_{shift}$ experienced by the free layer 404 can be canceled or substantially canceled because the magnetic material of the first reference layer 401 is disposed closer to the free layer 404 than if the magnetic material of the first reference layer 201 was to be formed to be part of the reference layer disposed on the other side of reference layer 406 from the free layer 404. Moreover, this embodiment also provides a significantly reduced sensitivity to variations in the shift field $H_{shift}$ as a function of cell-size variations.

FIG. 5 is an exemplary embodiment of a method 500 to form a B2-MTJ device according to the subject matter disclosed herein.

At 501, a first reference magnetic layer is formed using well-known techniques, such as, but not limited to atomic layer deposition (ALD), chemical vapor deposition (CVD) or Physical Vapor Deposition (PVD). In one embodiment, the first reference magnetic layer may comprise a single layer of ferromagnetic material. In another embodiment, the first reference magnetic layer may comprise a multilayer ferromagnetic structure. The amount of material used for the first reference magnetic layer is based on the antiferromagnetic exchange coupling between the first reference magnetic layer and a second reference magnetic layer that will be formed so that the shift field $H_{shift}$ experienced by a free magnetic layer that will be formed is canceled or substantially canceled. The first reference magnetic layer may also be formed on other structures, such as, but not limited to, a bottom electrode and a seeding layer.

At 502, a texture-blocking decoupling layer is formed on the first reference magnetic layer using well-known techniques, such as, but not limited to, ALD, CVD or PVC. In one embodiment, the texture-blocking decoupling layer may comprise an amorphous magnetic or an amorphous non-magnetic material.

At 503, a spacer layer may be optionally formed on the texture-blocking decoupling layer using well-known techniques, such as, but not limited to ALD, CVD or PVC. The spacer layer may comprise a magnetic or a non-magnetic material having a body-centered-cubic (BCC) crystalline structure.

At 504, a free magnetic layer is formed on the first reference magnetic layer using well known techniques, such as, but not limited to ALD, CVD or PVD. In one embodiment, the free magnetic layer may comprise a single layer of ferromagnetic material. In another embodiment, the free magnetic layer may comprise a multilayer ferromagnetic structure. In still another embodiment, other layers may be formed between the first reference magnetic layer and the free magnetic layer, such as, but not limited to, a texture-blocking decoupling layer, a seeding layer and a spacer layer.

At 505, a non-magnetic (tunnel junction) spacer layer is formed on the free magnetic layer using well known techniques, such as, but not limited to ALD, CVD or PVD.

At 506, a second reference magnetic layer is formed on the (tunnel junction) spacer layer using well known techniques, such as, but not limited to ALD, CVD or PVD. The second reference magnetic layer is formed to be antiferromagnetically coupled to the first reference magnetic layer. In one embodiment, the second reference magnetic layer may comprise a single layer of ferromagnetic material. In another embodiment, the second reference magnetic layer may comprise a multilayer ferromagnetic structure. Additional MTJ device layers may be optionally formed on the second reference magnetic layer.

FIG. 6 depicts an exemplary embodiment of a magnetic memory 600 that includes a magnetic tunnel junction (MTJ) device comprising a first magnetic reference layer and a free magnetic layer that are disposed on one side of a tunnel junction barrier and a second magnetic reference layer that is anti-magnetically exchanged coupled to the first reference magnetic layer is disposed on the other side of the tunnel junction barrier according to the subject matter disclosed herein. The magnetic memory 600 includes reading/writing column select drivers 602 and 606 and a word line select driver 604. It should be understood that other and/or different components may be provided that are not shown. A storage region of the memory 600 includes a plurality of magnetic storage cells 610 arranged in an array of rows and columns. Each magnetic storage cell 610 includes at least one magnetic junction device 612 and at least one selection device 614. In some embodiments, the selection device 614 is a transistor. The magnetic junction devices 612 may have a hybrid free magnetic layer according to the subject matter disclosed herein. Although one magnetic junction device 612 is shown per cell 610, in other embodiments, a different number of magnetic junction devices 612 may be provided per cell. As such, the magnetic memory 600 may enjoy the benefits described above.

FIG. 7 depicts an electronic device 700 that comprises one or more integrated circuits (chips) comprising a magnetic tunnel junction (MTJ) device comprising a first magnetic reference layer and a free magnetic layer that are disposed on one side of a tunnel junction barrier and a second magnetic reference layer that is anti-magnetically exchanged coupled to the first reference magnetic layer is disposed on the other side of the tunnel junction barrier according to the subject matter disclosed herein. Electronic device 700 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 700 may comprise a controller 710, an input/output device 720 such as, but not limited to, a keypad, a keyboard, a display, or a touch-screen display, a memory 730, and a wireless interface 740 that are coupled to each other through a bus 750. The controller 710 may comprise, for example, at least one microprocessor, at least one digital signal process, at least one microcontroller, or the like. The memory 730 may be configured to store a command code to be used by the controller 710 or a user data. Electronic device 700 and the various system components comprising electronic device 700 may comprise a magnetic tunnel junction (MTJ) device comprising a first magnetic reference layer and a free magnetic layer that are disposed on one side of a tunnel junction barrier and a second magnetic reference layer that is anti-magnetically exchanged coupled to the first reference magnetic layer is disposed on the other side of the tunnel junction barrier according to the subject matter disclosed herein. The electronic device 700 may use a wireless interface 740 configured to transmit data to or receive data from a wireless communication network using a RF signal. The wireless interface 740 may include, for example, an antenna, a wireless transceiver and so on. The electronic system 700 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

FIG. 8 depicts a memory system 800 that may comprise a magnetic tunnel junction (MTJ) device comprising a first magnetic reference layer and a free magnetic layer that are disposed on one side of a tunnel junction barrier and a second magnetic reference layer that is anti-magnetically exchanged coupled to the first reference magnetic layer is disposed on the other side of the tunnel junction barrier according to the subject matter disclosed herein. The memory system 800 may comprise a memory device 810 for storing large amounts of data and a memory controller 820. The memory controller 820 controls the memory device 810 to read data stored in the memory device 810 or to write data into the memory device 810 in response to a read/write request of a host 830. The memory controller 820 may include an address-mapping table for mapping an address provided from the host 830 (e.g., a mobile device or a computer system) into a physical address of the memory device 810. The memory device 810 may comprise one or more semiconductor devices comprising a magnetic tunnel junction (MTJ) device comprising a first magnetic reference layer and a free magnetic layer that are disposed on one side of a tunnel junction barrier and a second magnetic reference layer that is anti-magnetically exchanged coupled to the first reference magnetic layer is disposed on the other side of the tunnel junction barrier according to the subject matter disclosed herein.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:
1. A magnetic tunnel junction device, comprising:
 a first reference magnetic material layer;
 a tunnel barrier material layer;
 a free magnetic material layer between the first reference magnetic material layer and the tunnel barrier material layer;
 a second reference magnetic material layer disposed on an opposite side of the tunnel barrier material layer from the free magnetic material layer, the second reference magnetic material layer being anti-magnetically exchanged coupled with the first reference magnetic material layer; and
 a texture-blocking layer between the first reference magnetic material layer and the free magnetic material layer, the texture-blocking layer comprising an amorphous magnetic or an amorphous non-magnetic material.

2. The magnetic tunnel junction device according to claim 1, wherein a shift field Hshift experienced by the free magnetic material layer is substantially canceled by an anti-magnetic exchange coupling between the first reference magnetic material layer and the second reference magnetic material layer.

3. The magnetic tunnel junction device according to claim 2, wherein each of the first reference magnetic material layer, the free magnetic material layer and the second reference magnetic material layer comprise a perpendicular magnetic anisotropy.

4. The magnetic tunnel junction device according to claim 2, further comprising a substrate, the first reference magnetic material layer and the free magnetic material layer being disposed between the substrate and the tunnel barrier material layer.

5. The magnetic tunnel junction device according to claim 2, further comprising a third reference magnetic material layer disposed on an opposite side of the tunnel barrier material layer from the free magnetic material layer, the third reference magnetic material layer being anti-magnetically exchanged coupled with the second reference magnetic material layer.

6. The magnetic tunnel junction device according to claim 5, further comprising a conductive spacer layer disposed between the second reference magnetic material layer and the third reference magnetic material layer, the second and third reference magnetic material layers being anti-magnetically exchange coupled through the conductive spacer layer.

7. The magnetic tunnel junction device according to claim 5, wherein the second and third reference magnetic material layers are antiferromagnetic magnetic exchange coupled with each other.

8. The magnetic tunnel junction device according to claim 2, wherein the magnetic tunnel junction device comprises part of a magnetic memory device array.

9. A magnetic memory device, comprising:
 a first reference ferromagnetic material layer comprising a first surface and a magnetic field direction that includes a component that is substantially perpendicular to the first surface;
 a tunnel barrier material layer;
 a free ferromagnetic material layer between the first reference ferromagnetic material layer and the tunnel barrier material layer, the free ferromagnetic material layer comprising a magnetic field direction that includes a component that is substantially perpendicular to the first surface;
 a second reference ferromagnetic material layer disposed on an opposite side of the tunnel barrier material layer from the free ferromagnetic material layer, the second reference ferromagnetic material layer comprising a magnetic field direction that includes a component that is substantially perpendicular to the first surface, and the second reference ferromagnetic material layer being antiferromagnetically exchanged coupled with the first reference ferromagnetic material layer; and a texture-blocking layer between the first reference ferromagnetic material layer and the free ferromagnetic material layer, the texture-blocking layer comprising an amorphous magnetic or an amorphous non-magnetic material.

10. The magnetic memory device according to claim 9, wherein a shift field Hshift experienced by the free ferromagnetic material layer is substantially canceled by an antiferromagnetic exchange coupling between the first reference ferromagnetic material layer and the second reference ferromagnetic material layer.

11. The magnetic memory device according to claim 10, further comprising a substrate, the first reference ferromagnetic material layer and the free ferromagnetic material layer being disposed between the substrate and the tunnel barrier material layer.

12. The magnetic memory device according to claim 10, wherein the magnetic memory device comprises part of a magnetic memory device array.

13. The magnetic memory device according to claim 9, further comprising a third reference ferromagnetic material layer disposed on an opposite side of the tunnel barrier material layer from the free ferromagnetic material layer, the third reference ferromagnetic material layer comprising a magnetic field direction that includes a component that is substantially perpendicular to the first surface, and the third reference ferromagnetic material layer being antiferromagnetically exchange coupled with the second reference ferromagnetic material layer.

14. The magnetic memory device according to claim 13, further comprising a conductive spacer layer disposed between the second reference ferromagnetic material layer and the third reference ferromagnetic material layer, the second and third reference ferromagnetic material layers being antiferromagnetically exchanged coupled through the conductive spacer layer.

15. A method to form a magnetic tunnel junction device, the method comprising:

forming a first reference ferromagnetic material layer comprising a first surface and a magnetic field direction that includes a component that is substantially perpendicular to the first surface;

forming a texture-blocking layer on the first reference ferromagnetic material layer, the texture-blocking layer comprising an amorphous magnetic or an amorphous non-magnetic material;

forming a free ferromagnetic material layer on the texture-blocking layer, the free ferromagnetic material layer comprising a magnetic field direction that includes a component that is substantially perpendicular to the first surface;

forming a tunnel barrier material layer on the free ferromagnetic material layer, a diameter the magnetic tunnel junction device comprising a diameter that is substantially perpendicular to the first surface and that is less than about 25 nm; and forming a second reference ferromagnetic material layer on the tunnel barrier material layer, the second reference ferromagnetic material layer comprising a magnetic field direction that includes a component that is substantially perpendicular to the first surface, and the second reference ferromagnetic material layer being antiferromagnetically exchanged coupled with the first reference ferromagnetic material layer.

16. The method according to claim 15, wherein a shift field Hshift experienced by the free ferromagnetic material layer is substantially canceled by an antiferromagnetic exchange coupling between the first reference ferromagnetic material layer and the second reference ferromagnetic material layer.

17. The method according to claim 16, further comprising forming the magnetic tunnel junction device on a substrate, the first reference ferromagnetic material layer and the free ferromagnetic material layer being disposed between the substrate and the tunnel barrier material layer.

18. The method according to claim 15, further comprising:

forming a conductive spacer layer on the second reference ferromagnetic material layer; and forming a third reference ferromagnetic material layer on the conductive spacer layer, the third reference ferromagnetic material layer comprising a magnetic field direction that includes a component that is substantially perpendicular to the first surface, and the third reference ferromagnetic material layer being antiferromagnetically exchange coupled with the second reference ferromagnetic material layer through the conductive spacer layer.

* * * * *